US010820412B1

(12) United States Patent
Kuo et al.

(10) Patent No.: US 10,820,412 B1
(45) Date of Patent: Oct. 27, 2020

(54) CIRCUIT WIRE CROSSING STRUCTURE AND MANUFACTURING METHOD OF THE SAME

(71) Applicant: CYMMETRIK ENTERPRISE CO., LTD., Taipei (TW)

(72) Inventors: Shan-Jen Kuo, Taipei (TW); Frank Shang-Teng Chan, Taipei (TW); Yosephine Yulia Margaretha, Taipei (TW); Jung-Da Cheng, Taipei (TW); Jen-Chieh Wei, Taipei (TW)

(73) Assignee: CYMMETRIK ENTERPRISE CO., LTD., Taipei (TW)

( * ) Notice: Subject to any disclaimer, the term of this patent is extended or adjusted under 35 U.S.C. 154(b) by 0 days.

(21) Appl. No.: 16/596,552

(22) Filed: Oct. 8, 2019

(51) Int. Cl.
*H05K 1/02* (2006.01)
*H05K 3/46* (2006.01)
*H05K 1/11* (2006.01)

(52) U.S. Cl.
CPC ......... *H05K 1/0265* (2013.01); *H05K 1/0295* (2013.01); *H05K 1/11* (2013.01); *H05K 3/4685* (2013.01)

(58) Field of Classification Search
CPC .... H05K 1/0295; H05K 1/0298; H05K 1/181; H05K 3/4685
See application file for complete search history.

(56) References Cited

U.S. PATENT DOCUMENTS

| | | | | | |
|---|---|---|---|---|---|
| 3,597,839 | A | * | 8/1971 | Jaccodine | H01L 27/00 29/831 |
| 3,781,611 | A | * | 12/1973 | Loro | H01L 23/5381 257/692 |
| 5,109,270 | A | * | 4/1992 | Nambu | H01L 23/057 257/668 |
| 2004/0084212 | A1 | * | 5/2004 | Miller | H05K 1/0228 174/261 |

* cited by examiner

*Primary Examiner* — Jeremy C Norris
(74) *Attorney, Agent, or Firm* — Maschoff Brennan

(57) ABSTRACT

A circuit wire crossing structure, comprising a substrate with a supporting surface, an electrical circuit disposed on the supporting surface of the substrate, with the electrical circuit comprising, two lateral wires with one of the wires having a first terminal and a second terminal and another one of the lateral wires having a second terminal, wherein the first terminal and the second terminal are spaced apart from each other, and a central wire, disposed between and apart from the first terminal and the second terminal, and an electronic component arranged above the supporting surface and two terminals of the electronic component connecting with the first terminal and the second terminal, wherein the electronic component has an insulating shell facing the central wire, and an orthographic projection of the electronic component to the supporting surface extends across an orthographic projection of the central wire to the supporting surface.

16 Claims, 5 Drawing Sheets

CIRCUIT WIRE CROSSING STRUCTURE AND MANUFACTURING METHOD OF THE SAME

BACKGROUND

1. Technical Field

This disclosure relates to a circuit wire crossing structure and manufacturing method of the same, more particularly to a wire crossing structure suitable for a single layer circuit.

2. Related Art

Generally, a circuit wire crossing structure is realized by a substrate with multilayer. That is, when two wires intersect, one of the wires must be sunk into another layer to cross the other wire that is disposed on the surface of the substrate.

The above illustrated and traditional way is commonly used and applied to various kinds of electronic products a substrate with multilayer; however, it is impossible to apply this technique to a circuit design on a substrate that is too weak or sensitive to form through-holes. In other words, a new circuit wire crossing structure is in need to realize electronic products with circuits formed on substrates that can't have through-holes.

SUMMARY

According to one or more embodiment of this disclosure, a circuit wire crossing structure, comprising: a substrate with a supporting surface; an electrical circuit disposed on the supporting surface of the substrate, with the electrical circuit comprising: two lateral wires with one of the wires having a first terminal and a second terminal and another one of the lateral wires having a second terminal, wherein the first terminal and the second terminal are spaced apart from each other; and a central wire, disposed between and apart from the first terminal and the second terminal; and an electronic component arranged above the supporting surface and two pins of the electronic component connecting with the first terminal and the second terminal, wherein the electronic component has an insulating shell facing the central wire, and an orthographic projection of the electronic component to the supporting surface extends across an orthographic projection of the central wire to the supporting surface.

According to one or more embodiment of this disclosure, a method of manufacturing circuit crossing structure, comprising: providing a substrate with a supporting surface; forming two lateral wires and a central wire on the supporting surface, with the two lateral wires respectively have a first terminal and a second terminal spaced apart from each other, and with the central wire disposed between and apart from the first and second terminals; and disposing an electronic component above the supporting surface and crossing the central wire, with two terminals of the electronic component connecting to the first and second terminals respectively.

BRIEF DESCRIPTION OF THE DRAWINGS

The present disclosure will become more fully understood from the detailed description given hereinbelow and the accompanying drawings which are given by way of illustration only and thus are not limited to the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
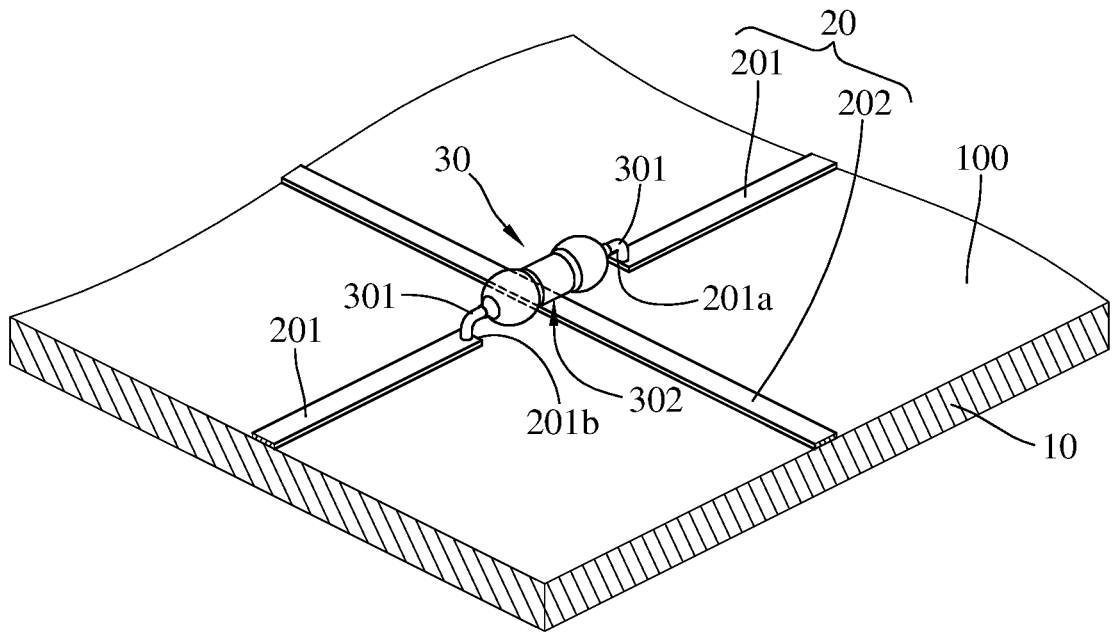
FIG. 1A is a perspective view of an embodiment of a circuit wire crossing structure according to the present disclosure.

Please refer to FIG. 1A. FIG. 1A is a perspective view of an embodiment of a circuit wire crossing structure according to the present disclosure. The circuit wire crossing structure 1 comprises a substrate 10, an electrical circuit 20 and an electronic component 30.

The substrate 10 comprises a supporting surface 100, wherein the substrate 10 may be a monolayer structure. Specifically, the substrate 10 may be a rigid circuit board or a monolayer flexible circuit board. The substrate 10 may be made from polyethylene terephthalate (PET), polyimide, glass epoxy or FR4. However, the present disclosure is not limited thereto.

The electrical circuit 20 is disposed on the supporting surface 100 of the substrate 10. The electrical circuit 20 comprises two lateral wires 201, wherein one of the wires 201 having a first terminal 201a and another one of the lateral wires 201 having a second terminal 201b. The first terminal 201a and the second terminal 201b are spaced apart from each other. Please note that the first and second terminals 201a, 201b are not necessary to be physical ends of the lateral wires 201; namely, any portions of the first and second lateral wires 201 to be connected to the electronic component 30 can be defined as the first and second terminals 201a, 201b.

The electrical circuit 20 further comprises a central wire 202, wherein the central wire 202 is disposed between the first terminal 201a and the second terminal 201b while apart from the first terminal 201a and the second terminal 201b. In other words, the two lateral wires 201 are respectively disposed on two opposite sides of the central wire 202. Wherein the two lateral wires 201 and the central wires 202 preferably are wires having the function of transmitting electrical signals and are designed to be separated from each other.

The electronic component 30 is arranged above the supporting surface 100, and two terminals 301 of the electronic component 30 respectively connect with the first terminal 201a and the second terminal 201b, so that electrical signals may be received from one of the lateral wires 201 and transmitted to the other thereof. The electronic component 30 has an insulating shell 302 which faces the central wire 202, so that the electronic component 30 is not in electrical connection with the central wire 202. In other words, the insulating shell 302 is located between a conductive part of the electronic component 30 and the central wire 202. Specifically, the electronic component 30 may have an insulating housing while the insulating shell 302 is a lower part of the insulating housing close to the central wire 202. The electronic component 30 is preferably, but not limited to, a passive component such as a resistor, an inductor or a capacitor. The electronic component 30 may also be other types of electronic components with an insulating housing.

Figure 1B:
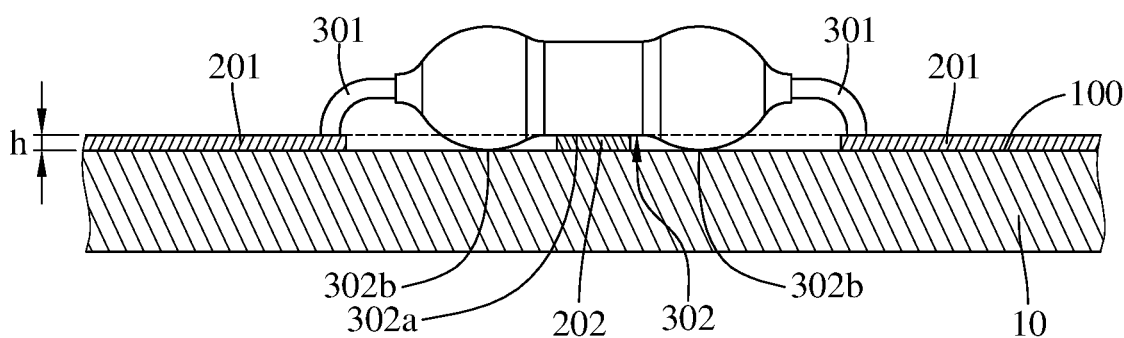
FIG. 1B is a perspective side view of a circuit wire crossing structure according to the present disclosure.

To better understand the present embodiment, please refer to FIG. 1B. FIG. 1B is a perspective side view of a circuit wire crossing structure according to the present disclosure. To be more specific, the two lateral wires 201 and the central wire 202 preferably have an identical height "h" relative to the supporting surface 100, with the electronic component 30 disposed above the central wire 202. That is, the height "h" shown here is the thickness of the two lateral wires 201 in a thickness direction perpendicular to the supporting surface 100. However, the present disclosure is not limited to the two lateral wires 201 and the central wire 202 having identical height "h". The two lateral wires 201 and the central wire 202 can also have different heights relative to the supporting surface 100. More specifically, the central wire 202 may also be realized by being disposed in a groove of the substrate 10.

Please continue referring to FIG. 1B. The electronic component 30 may be in contact with the central wire 202. To be more specific, the electronic component 30 may rest on the central wire 202 with a recess 302a of the insulating shell 302 preferably faces the central wire 202 for the central wire 202 to pass through. Furthermore, with the central wire 202 extending across the electronic component 30 via the recess 302a and the depth of the recess 302a larger than the height "h" of the central wire 202, two sides 302b of the insulating shell 302 may abut on the supporting surface 100. Wherein, the recess 302 may be formed from a groove which surrounds the insulating housing of the electronic component 30. The groove shown in FIG. 1B is only an exemplary illustration, the groove is not limited to any shapes or sizes. That is, the groove can be circular, rectangular, triangular etc., the present disclosure is not limited thereto.

Figure 1C:
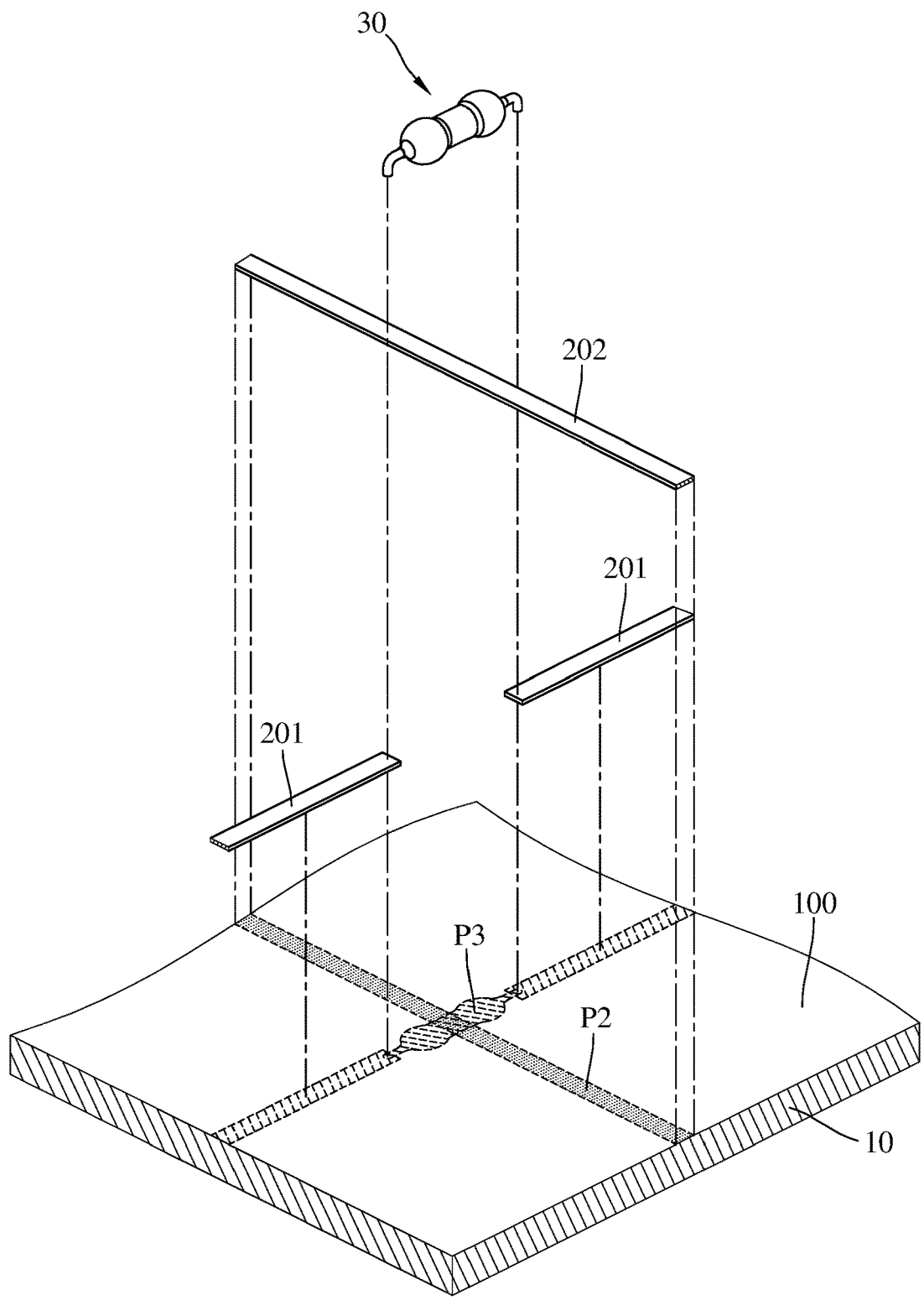
FIG. 1C is an exploded view of a circuit wire crossing structure according to FIG. 1A.

Please refer to FIG. 1A again as well as FIG. 1C. FIG. 1C is an exploded view of a circuit wire crossing structure according to FIG. 1A. Both the central wire 202 and the electronic component 30 are arranged above the supporting surface 100, with the electronic component 30 disposed above the central wire 202. An orthographic projection P2 of the central wire 202 on the supporting surface 100 extends across an orthographic projection P3 of the electronic component 30 on the supporting surface 100. In other words, the orthographic projection P2 of the central wire 202 on the supporting surface 100 intersects the orthographic projection P2 of the electronic component 30 on the supporting surface 100.

Figure 2A:
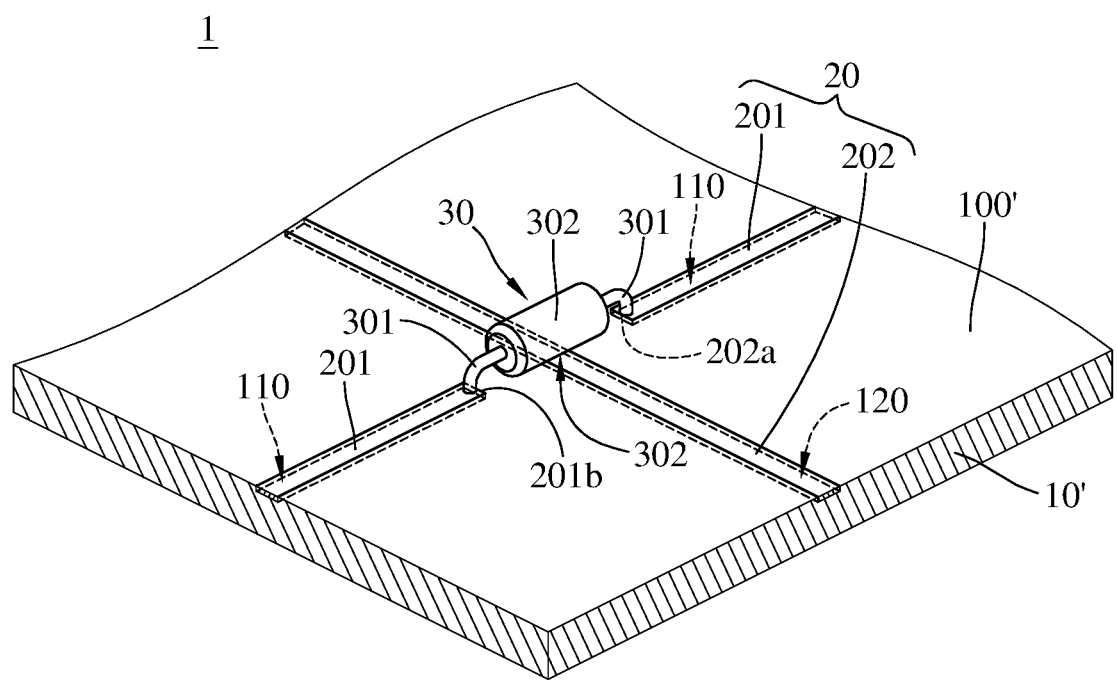
FIG. 2A is a perspective view of another embodiment of a circuit wire crossing structure according to the present disclosure.
Figure 2B:
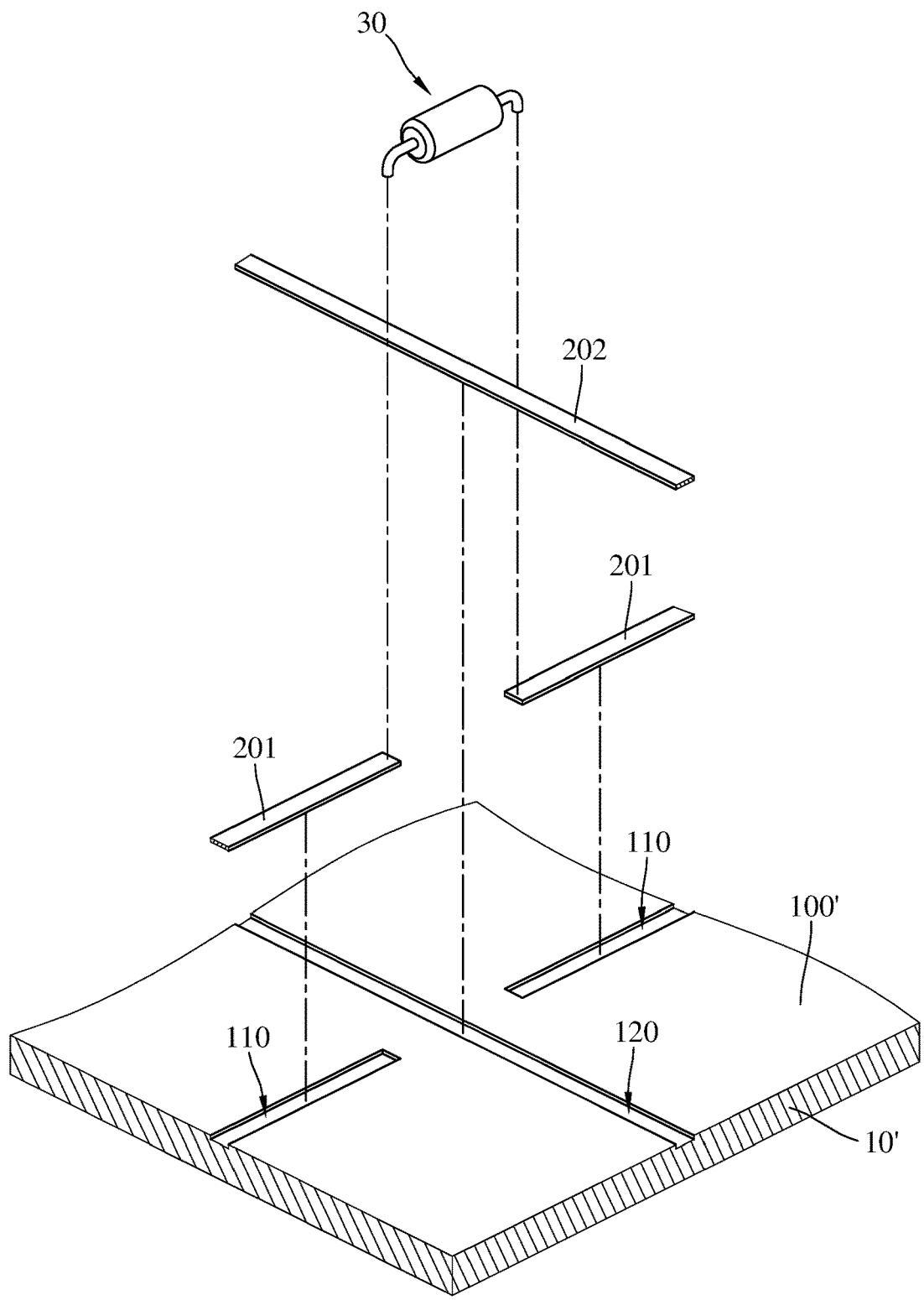
FIG. 2B is an exploded view of another embodiment of a circuit wire crossing structure according to the present disclosure.

Please refer to FIGS. 2A and 2B. FIGS. 2A and 2B are a perspective view and an exploded view of another embodiment of a circuit wire crossing structure according to the present disclosure. In comparison with the previously illustrated embodiment, the supporting surface 100' of the substrate 10' of this embodiment further forms two grooves 110 housing the two lateral wires 201 and a groove 120 housing the central wire 202. To be more specific, parts of the supporting surface 100' defining the grooves 110 and 120 are sunk from other parts of the supporting surface 100'. Alternatively, the substrate 10' may also be realized with only the groove 120 for housing the central wire 202. That is, the two lateral wires 201 and the central wire 202 can have different heights relative to the supporting surface 100', and the present invention is not limited thereto. With the central wire 202 received in the groove 120, and electronic component 30 without the recess 302a can also be firmly supported by parts of the supporting surface 100' adjacent to the groove 120.

Figure 3:
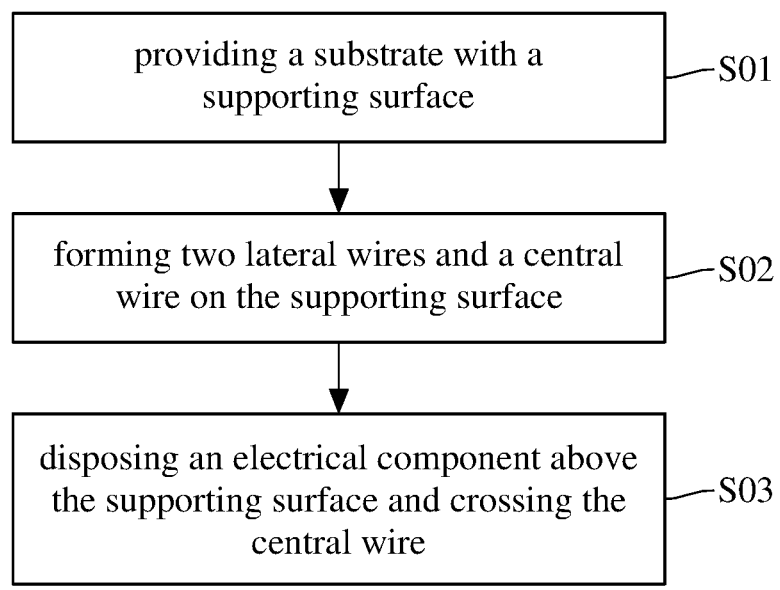
FIG. 3 is a flow chart of a method of manufacturing circuit crossing structure according to an embodiment of the present disclosure.

Please refer to FIG. 1A, FIG. 1B and FIG. 3, wherein FIG. 3 is a flow chart of a method of manufacturing circuit wire crossing structure according to an embodiment of the present disclosure. The method mainly comprises step S01, S02, and S03. Specifically, step S01 comprises: providing the substrate 10 with the supporting surface 100, which is preferably realized by selecting a monolayer structure as the substrate 10.

Wherein, step S01 may also be realized by providing a substrate 10' with forming grooves 110 and 120 on the substrate 10' to house the two lateral wires 201 and the central wire 202. And the surfaces of the grooves 110 and 120 are the supporting surface 100.

Step S02 of the method comprises: forming two lateral wires 201 and the central wire 202 on the supporting surface 100, which is preferably realized by printing the two lateral wires 201 and the central wire 202 on the supporting surface 100, so that the two lateral wires 201 and the central wire 202 may have an identical height "h" relative to the supporting surface 100. Wherein, printing the two lateral wires 201 and the central wire 202 described is preferably performed by one-time printing, preferably the two lateral wires 201 and the central wire 202 being formed on the supporting surface 100 at the same time. Alternatively, when there is only the groove 120 formed on the substrate 10, forming the two lateral wires 201 and the central wire 202 on the supporting surface 100 can also realize the structure of the two lateral wires 201 and the central wire 202 having different heights relative to the supporting surface 100.

To be more specific, the two lateral wires 201 respectively have the first terminal 201a and the second terminal 201b. The first terminal 201a and the second terminal 201b are spaced apart from each other, wherein the central wire 202 is disposed between and apart from the first terminal 201a and the second terminal 201b.

The method further comprises step S03: disposing an electronic component 30 above the supporting surface 100 and crossing the central wire 202, with two terminals 301 of the electronic component 30 connecting to the first terminal 201a and the second terminal 201b. Wherein disposing the electronic component 30 crossing the central wire 202 further comprises resting an insulating shell 302 of the electronic component 30 on the central wire 202, while passing the central wire 202 through the recess 302a of the insulating shell 302, and abutting two sides 302b of the insulating shell 302 on the supporting surface 100, so that the electronic component 30 is not directly in electrical connection with the central wire 202.

Continued from the above, when the electronic component 30 crosses the central wire 202, the method of manufacturing circuit crossing structure 1 comprises having an orthographic projection P3 of the electronic component 30 to the supporting surface 100 extend across an orthographic projection P2 of the central wire 202 to the supporting surface 100. In other words, the orthographic projections P2 and P3 intersects with each other on the supporting surface 100, so that the electrical signals transmitted through the two lateral wires 201 (via the electronic component 30) and the central wire 202 aren't interfering with each other.

In view of the above description, the above embodiments of the present disclosure may realize the circuit wire crossing structure suitable for single-layer circuit design implemented to circuit substrates that are unable to have a through-hole due to specific reasons, for example in strength or manufacturing process of the substrate. Furthermore, according to one or more embodiments of the circuit wire crossing structure and method of manufacturing the same proposed by the present disclosure, the circuit patterns may also be simplified without the needs to form a through-hole. In addition, the size of the circuit wire crossing structure may also be reduced since the through-hole necessary in a conventional PCB is avoided. Therefore, although the disclosed circuit wire crossing structure is suitable for implementing a single layer circuit design, it may also be used in a circuit with a multilayer design to reduce the size of the circuit.

The present disclosure has been disclosed above in the embodiments described above, however it is not intended to limit the present disclosure. It is within the scope of the present disclosure to be modified without deviating from the essence and scope of it. It is intended that the scope of the present disclosure is defined by the following claims and their equivalents.

scope of the present disclosure is defined by the following claims and their equivalents.

What is claimed is:

1. A circuit wire crossing structure, comprising:
   a substrate with a supporting surface;
   an electrical circuit disposed on the supporting surface of the substrate, with the electrical circuit comprising:
      two lateral wires with one of the wires having a first terminal and another one of the lateral wires having a second terminal, wherein the first terminal and the second terminal are spaced apart from each other; and
      a central wire, disposed between and apart from the first terminal and the second terminal; and
      an electronic component having two terminals and an insulating shell, with the electronic component arranged above the supporting surface and the two terminals connecting with the first terminal and the second terminal, wherein an outer surface of the insulating shell faces the central wire, the central wire locates between two sides of the insulating shell that are in contact with the supporting surface, and an orthographic projection of the electronic component to the supporting surface extends across an orthographic projection of the central wire to the supporting surface.

2. The circuit crossing structure of claim 1, wherein the insulating shell rests on the central wire.

3. The circuit crossing structure of claim 2, wherein the insulating shell has a recess for the central wire to pass through.

4. The circuit crossing structure of claim 3, wherein the electrical component is a passive component.

5. The circuit crossing structure of claim 1, wherein the two lateral wires and the central wire have an identical height relative to the supporting surface.

6. The circuit crossing structure of claim 1, wherein the two lateral wires and the central wire have different heights relative to the supporting surface.

7. The circuit crossing structure of claim 1, wherein the supporting surface of the substrate has a groove to house the central wire.

8. The circuit crossing structure of claim 7, wherein parts of the supporting surface defining the groove is sunk from other parts of the supporting surface.

9. A method of manufacturing circuit crossing structure, comprising:
   providing a substrate with a supporting surface;
   forming two lateral wires and a central wire on the supporting surface, with the two lateral wires respectively have a first terminal and a second terminal spaced apart from each other, and with the central wire disposed between and apart from the first and second terminals; and
   disposing an electronic component having two terminals and an insulating shell above the supporting surface and crossing the central wire, with two terminals connecting to the first and second terminals respectively, an outer surface of the insulating shell facing the central wire, and the central wire locating between two sides of the insulating shell that are in contact with the supporting surface.

10. The method of claim 9, disposing the electronic component above the supporting surface and crossing the central wire comprising: having an orthographic projection of the electronic component to the supporting surface extend across an orthographic projection of the central wire to the supporting surface.

11. The method of claim 9, wherein disposing the electronic component above the supporting surface and crossing the central wire comprising: resting the insulating shell of the electronic component on the central wire.

12. The method of claim 11, wherein resting the insulating shell of the electronic component on the central wire comprising: passing the central wire through a recess of the insulating shell.

13. The method of claim 9, wherein forming the two lateral wires and the central wire on the supporting surface comprising: having the two lateral wires and the central wire have an identical height relative to the supporting surface.

14. The method of claim 9, wherein forming the two lateral wires and the central wire on the supporting surface comprising: having the two lateral wires and the central wire have different heights relative to the supporting surface.

15. The method of claim 9, wherein forming the two lateral wires and the central wire on the supporting surface comprising: printing the two lateral wires and the central wire on the supporting surface.

16. The method of claim 9, wherein providing the substrate with the supporting surface comprising: forming a groove with the supporting surface of the substrate housing the central wire.

* * * * *